United States Patent [19]
Beisswenger et al.

[11] Patent Number: 5,266,117
[45] Date of Patent: Nov. 30, 1993

[54] APPARATUS FOR THE EVAPORATIVE COATING OF SUBSTRATES

[75] Inventors: Siegfried Beisswenger, Alzenau-Wasserlos; Anton Pawlakowitsch, Mömbris; Reiner Kukla, Hanau, all of Fed. Rep. of Germany

[73] Assignee: Leybold AG, Hanau, Fed. Rep. of Germany

[21] Appl. No.: 6,900

[22] Filed: Jan. 21, 1993

[30] Foreign Application Priority Data

Jan. 22, 1992 [DE] Fed. Rep. of Germany ....... 4201584

[51] Int. Cl.⁵ ............................................. C23C 14/26
[52] U.S. Cl. .................................. 118/726; 118/719; 392/388
[58] Field of Search ................. 118/726, 719; 392/388

[56] References Cited

U.S. PATENT DOCUMENTS

| 4,406,252 | 9/1983 | Jones | 118/726 |
| 4,820,106 | 4/1989 | Walde | 118/719 |
| 5,198,272 | 3/1993 | Eisfeller | 118/726 |

FOREIGN PATENT DOCUMENTS 61-79763  4/1986  Japan .................. 118/726

Primary Examiner—Richard Bueker
Attorney, Agent, or Firm—Felfe & Lynch

[57] ABSTRACT

A vacuum chamber contains means for transferring a substrate for an information disc such as a CD from a loading station to a coating station, where material such as aluminum in wire form is evaporated in order to coat the substrate from above. An evaporation nozzle is continuously supplied with wire at a rate according to the coating thickness. The nozzle may be heated either resistively in order to evaporate the wire therein, or the wire may be directly heated by an induction coil.

7 Claims, 3 Drawing Sheets

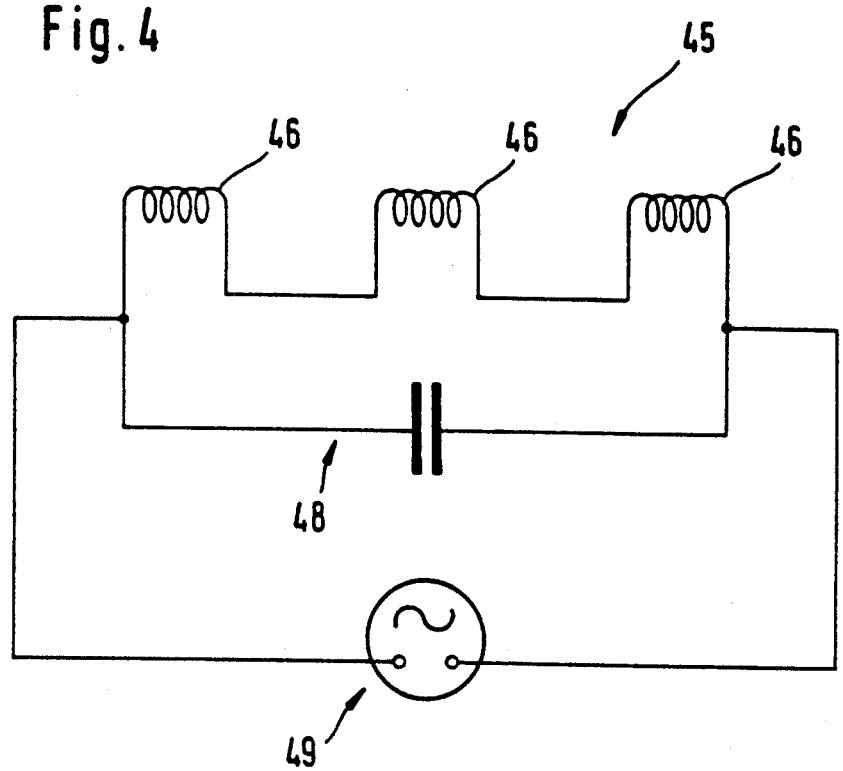

APPARATUS FOR THE EVAPORATIVE COATING OF SUBSTRATES

BACKGROUND OF THE INVENTION

The invention relates to a device for the coating of a substrate in a vacuum chamber. A substrate holder located in this vacuum chamber has at least one substrate location seat that can be moved by means of a driving motor from a loading station to a coating station in the vacuum chamber where an evaporation nozzle supplied with material in wire form is located.

It is known already to coat a small size compact disk of polycarbonate. Since it is very difficult to coat a polycarbonate disk having a diameter of approximately 300 mm (12 inches), this cannot be perfected with conventional sputtering technology. For this reason, the relatively large video disks for carrying optic and acoustic signals are made from PMMA (polymethylmethacrylate). The optic and acoustic information, after having been converted into digital form, is located in spiral arrangement of pits on the plastic medium and is read by a laser beam which is approximately 1 $\mu$mm wide. The information is contained in the length and the depth of the pits. The indentations in the carrier material PMMA are covered on one side with a layer aluminum and an additional protective layer (lacquer). Double-sided video disks have the same design. In principle, they consist of two disks glued together.

The adhesiveness of the materials applied to the PMMA substrates during cathode sputtering, however, is not sufficient. The materials applied can easily be stripped off, which can lead to quality problems.

It is known to coat such video disks by means of so-called batch systems and/or one-chamber system that are to be operated on a discontinuous basis. However, these processes are complicated and expensive since they need to be loaded often and individually.

SUMMARY OF THE INVENTION

The invention provides system for the cost-effective and reliable production of CDs and/or video disks by coating from above in a cycle process.

The material to be evaporated is replenished depending on the amount of material to be used in coating the substrate.

The apparatus preferably includes a metal block equipped with at least one nozzle having a bore through which the material to be evaporated flows. If the material to be evaporated consists of a wire, in particular a metal wire, a wire feeder supplies wire to the bore.

This ensures in a simple manner that only that amount of aluminum which is actually needed on the substrate is evaporated. Since only the required amount of material is evaporated, this prevents the parts which are not to be exposed to the vapor from being contaminated. Furthermore, the high purity prevents the precipitation of particles on the substrate located in the machine which would otherwise lead to a deterioration in the quality of the substrate. The design provides a controllable sputtering process, particularly if the nozzle is located vertically and therefore sputters the substrate or the compact disk from above. Furthermore, the effectiveness of the total system can be improved considerably by reducing the scrap rate. For this purpose it is beneficial if the metal part is replenished continuously depending on the amount of material applied on the substrate by evaporation. It is also beneficial if the metal block is surrounded by an insulating part. This helps to ensure that only that amount of material necessary for the coating process is supplied. In connection with the beneficial design of the nozzle, impulse evaporation is feasible without a problem since a concentrated supply of heat with little heat radiation is possible.

Due to the measured supply of an aluminum wire through a ceramic pot contained in the copper block, it is possible to interrupt the power supply and the supply of the aluminum wire for a very short period of time after coating each disk and then to reconnect the power supply when a new disk has been supplied to the system. With the known sputtering processes utilizing evaporation boats, coating still takes place even when not desired since the relatively high evaporation temperature cannot be corrected that quickly.

The design of the nozzle as outlined by the invention and the possibility to turn the heating on and off for short periods of time (and to create an impulse evaporation process, i.e. a flash evaporation process) makes it possible to coat the substrates serially.

The material feeding system may include transport rollers that are spaced so that the material feeding system can move the material to be evaporated through the evaporation nozzle in a cyclical process. The video disk is transported into the evaporation system, and the evaporation nozzle is heated entirely or partially by means of a heating system. The evaporation nozzle can be heated in an impulse manner which is dependent on the usage of the material to be evaporated.

If the coating material is evaporated in the nozzle, the main bore in the evaporation nozzle may branch into two or more outlet openings located in symmetrical arrangement with respect to the center line of the nozzle. For example, the openings may be located on a circular or oval line coaxial to the center line.

It is beneficial if the evaporation nozzle is heated more strongly at the inlet than at the outlet, so that material to be evaporated has always been transformed into its vapor state once it reaches the area of the outlet. This prevents material from dripping out of the opening and accumulating on the substrate. In order to cause sudden increase in the heat transmission toward the opening, a bushing made of boron nitride, can be provided in the nozzle.

BRIEF DESCRIPTION OF THE DRAWING

FIG. 4 shows the electric circuitry when using three evaporators.

DETAILED DESCRIPTION OF THE PREFERRED EMBODIMENT

Figure 1:
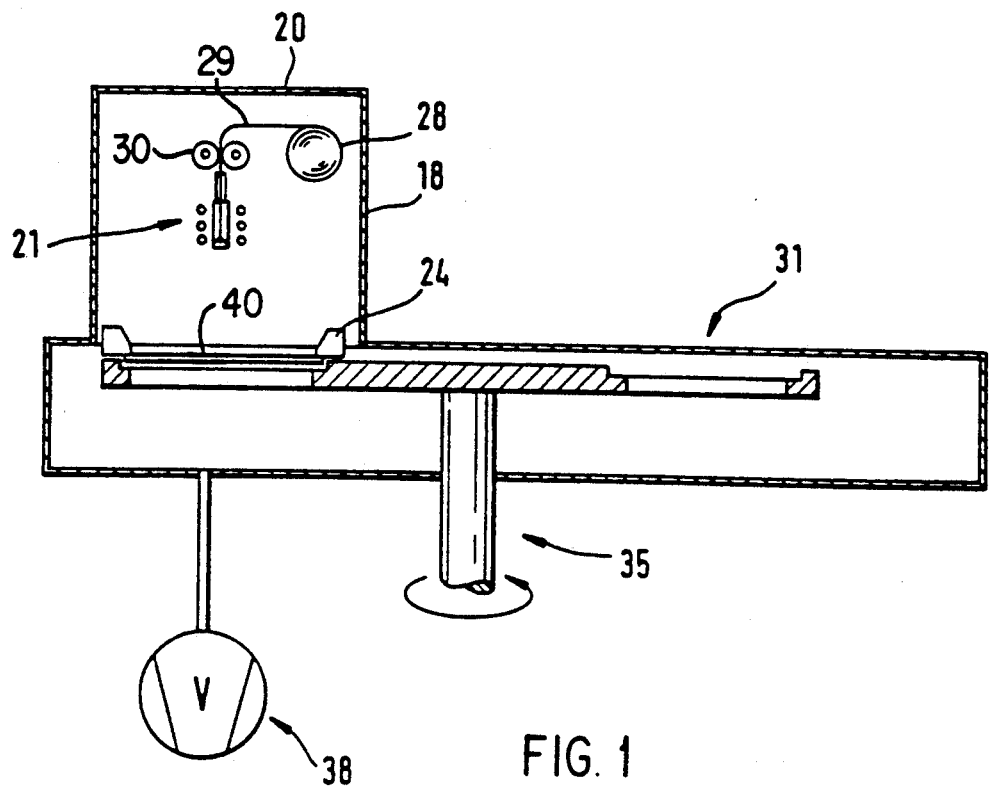
FIG. 1 is a schematic section view of a coating chamber having a carousel for transferring a substrate to a coating station where an evaporative coating is applied.

Referring to FIG. 1, the system for transferring substrates includes a vacuum chamber 51, a turntable 31, and a substrate holder 24. For complete disclosure of a suitable transfer system, see U.S. Pat. No. 4,820,106, which is incorporated herein by reference.

The evaporation unit 18 includes housing 20, located above vacuum chamber 51, which housing and vacuum chamber are evacuated by a vacuum pump 38.

The evaporation unit 18 includes a metal coil 28, in particular an aluminum wire coil, for supplying wire 29 to two transport rollers 30 arranged in a horizontal plane. These in turn supply the wire 29 to an evaporation head 21 illustrated in more detail FIGS. 3 and 6.

Figure 2:
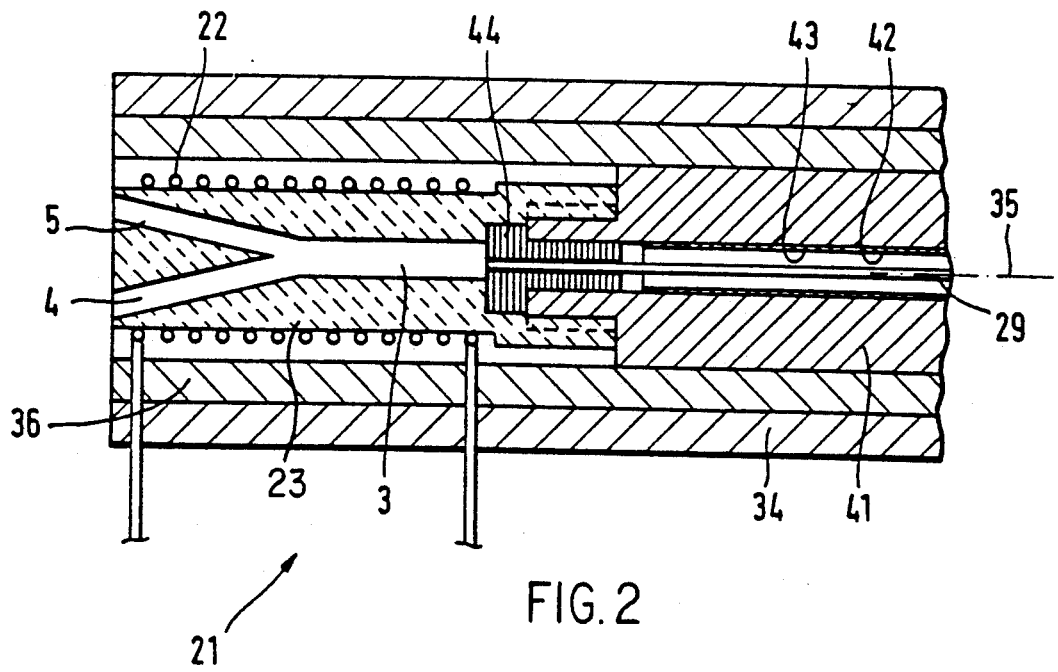
FIG. 2 shows a nozzle head where wire is evaporated inside the head.

The evaporation nozzle 21 in accordance with FIG. 2 includes an outer nozzle casing 34, preferably $Al_2O_3$, which has a coaxial arrangement to the center line 35. The evaporation head 21 can be heated entirely or partially by means of a tungsten heating coil 22. A graphite jacket 36 is located between the outer casing 34 and the coil 22. The casing 34 and the insulating jacket 36 surround a cylindrical copper block 41 with a concentric bore 42 which receives a sleeve 43 made of V2A through which the aluminum wire 29 is fed. V2A is a nickel-chrome alloy.

The diameter of the aluminum wire 29 can be between 0.5 and 3 mm, in particular between 1.2 and 1.8 mm, preferably 1.5 mm.

A bushing 44 made of boron nitride is inserted into the front end of the bore 42 in the copper block 41. This results in a poor heat transmission between the nozzle block 23 and copper block 41, which results in a very high heat gradient in this area. It is thus ensured that the wire does not melt inside the supply pipe 43, but rather after having reached the nozzle 23, which is also boron nitride. The bushing 44 can consist of coaxially arranged annular discs having apertures sized to closely accommodate the wire.

The wire is evaporated in bore 3 of nozzle portion 23. The bore 3 splits into two outlets 4, 5 next to each other in a cross-sectional plane. It is also possible to locate numerous nozzle outlets in a circular, oval or other type of arrangement in order to influence the emerging cone of the evaporated material. By using a nozzle with several outlets, a more localized evaporation process can be achieved with regard to the substrate.

This type of nozzle makes it possible to locate an evaporation head 21 in vertical direction and to apply vaporized material to the substrate from above.

Figure 3:
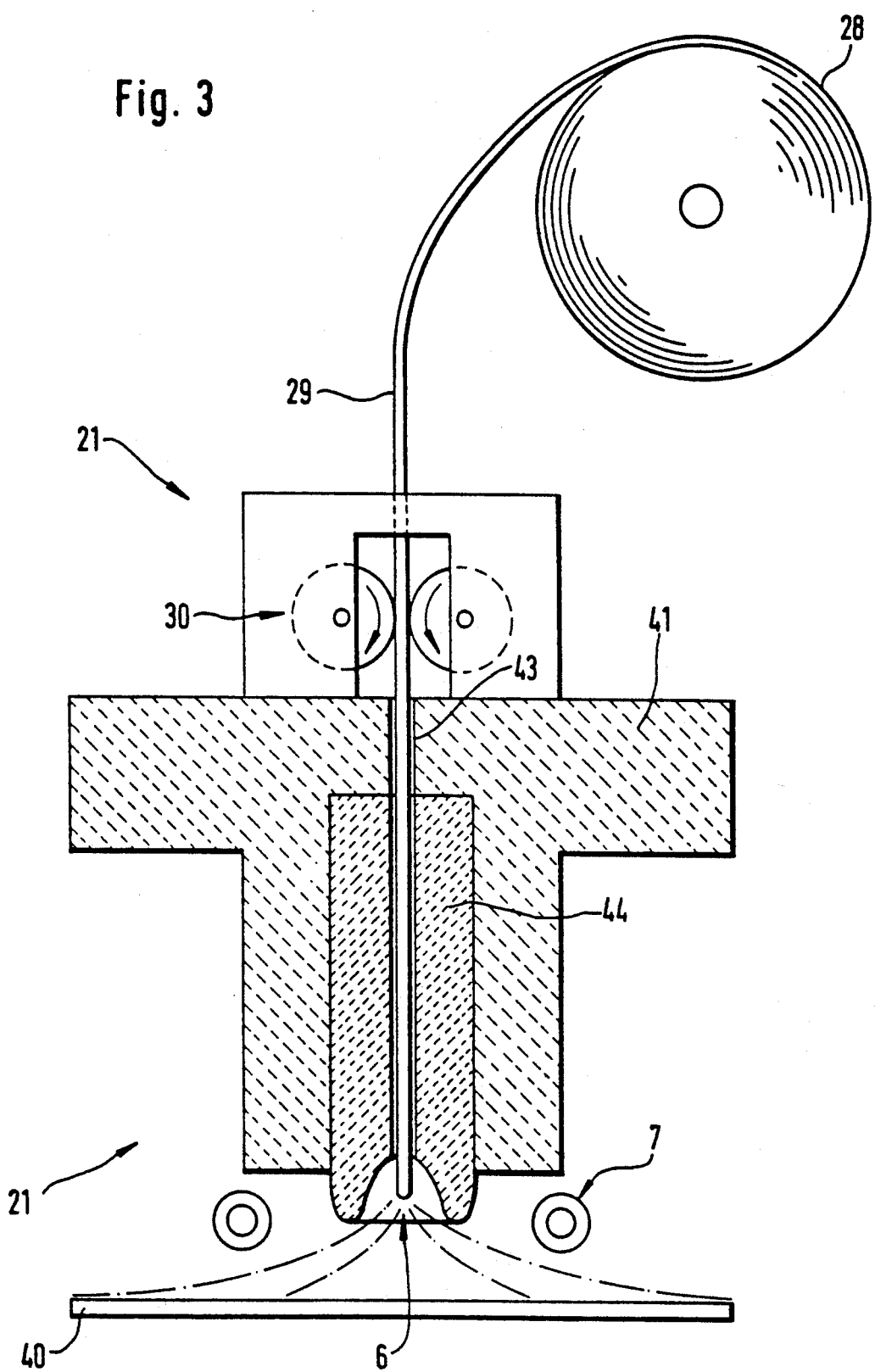
FIG. 3 shows a nozzle head where the wire is evaporated outside the head.

In FIG. 3 an outlet opening 6 is shaped like a converging funnel and an inductive heating coil 7 is located exactly on the horizontal plane on the outlet surface of the nozzle. In this embodiment the insulating bushing 44, preferably boron nitride, is placed at the opening in order to prevent heat transfer away from the wire being evaporated. The block 41 is preferably also a ceramic such as $Al_2O_3$.

A targeted, very rapid and pointed application of vaporized material can be achieved. By pushing the aluminum wire 29 forward into the melting zone defined by the heating system 7, the material melts at the end of the nozzle outlet at a temperature of about 1200° C. so that a precisely controlled evaporation process becomes feasible. In a simple manner, this results in an even coating of a circular substrate.

FIG. 4 shows another design alternative of an electric circuitry for an induction heating feature 45 with three inductance coils 46 to which an HF transmitter 49 (as the source of electric power) as well as a resonant circuit 48 belongs.

The heating is achieved by means of an eddy current so that this heating device only heats the material to be evaporated, for instance the aluminum wire, and not the parts of the heating device that surround the aluminum wire. The inductance coils are each located around an evaporation nozzle 21, as illustrated in FIG. 3, and heat the wire to be melted by means of inductive coupling.

While the entire evaporation nozzle 21 is heated by means of head radiation or conduction in accordance with the first design alternative (FIG. 2), the evaporation nozzle 21 in accordance with a second design alternative (FIGS. 3 and 4) is heated by means of induction only at the desired location, i.e. where the material to be evaporated (wire 29) is located within the inductance coil so that a higher degree of effectiveness is achieved while resulting in lower thermal stress for the entire device.

We claim:

1. Apparatus for coating a substrate with evaporated material, said apparatus comprising
   a vacuum chamber having means therein for transferring a substrate from a loading station to a coating station,
   an evaporation nozzle located above said coating station, said nozzle having a passage for passing said material therethrough, said passage having a central axis, said nozzle further having heating means for evaporating said material, and
   wire supply means for continuously supplying said material in wire form to said passage for evaporation.

2. Apparatus as in claim 1 wherein said nozzle comprises a metal portion having outlet means for said passage, said heating means comprising a resistance coil around said metal portion for vaporizing material in said passage.

3. Apparatus as in claim 2 wherein said nozzle further comprises a heat insulating bushing adjacent to said metal portion and opposite from said outlet means, said insulating bushing being coaxial to said passage.

4. Apparatus as in claim 2 wherein said outlet means comprises a plurality of openings communicating with said passage.

5. Apparatus as in claim 4 wherein said openings are symmetrically situated with respect to the axis of said passage.

6. Apparatus as in claim 1 wherein said heating means comprises an induction coil coaxially situated with respect to the axis of said passage.

7. Apparatus as in claim 6 wherein said nozzle comprises a dielectric portion having outlet means for said passage, said induction coil being effective to evaporate said material as it emerges from said outlet means.

* * * * *